(12) United States Patent
Kang et al.

(10) Patent No.: US 9,908,990 B2
(45) Date of Patent: Mar. 6, 2018

(54) ORGANIC LAYER COMPOSITION, ORGANIC LAYER, AND METHOD OF FORMING PATTERNS

(71) Applicant: SAMSUNG SDI CO., LTD., Yongin-si, Gyeonggi-do (KR)

(72) Inventors: Sun-Hae Kang, Suwon-si (KR); Youn-Hee Nam, Suwon-si (KR); Min-Soo Kim, Suwon-si (KR); Dominea Rathwell, Suwon-si (KR); You-Jung Park, Suwon-si (KR); Hyun-Ji Song, Suwon-si (KR); Sun young Yang, Suwon-si (KR)

(73) Assignee: SAMSUNG SDI CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/952,269

(22) Filed: Nov. 25, 2015

(65) Prior Publication Data
US 2016/0304700 A1 Oct. 20, 2016

(30) Foreign Application Priority Data

Apr. 17, 2015 (KR) .................. 10-2015-0054584
Oct. 2, 2015 (KR) .................. 10-2015-0139229

(51) Int. Cl.
| | | |
|---|---|---|
| *C09K 13/06* | (2006.01) |
| *C08K 5/18* | (2006.01) |
| *C08K 5/06* | (2006.01) |
| *C08L 65/00* | (2006.01) |
| *G03F 7/16* | (2006.01) |
| *G03F 7/20* | (2006.01) |
| *G03F 7/32* | (2006.01) |
| *G03F 7/36* | (2006.01) |
| *G03F 7/11* | (2006.01) |
| *C08K 5/07* | (2006.01) |
| *C08K 5/13* | (2006.01) |

(52) U.S. Cl.
CPC .............. *C08K 5/18* (2013.01); *C08K 5/06* (2013.01); *C08K 5/07* (2013.01); *C08K 5/13* (2013.01); *C08L 65/00* (2013.01); *G03F 7/11* (2013.01); *G03F 7/162* (2013.01); *G03F 7/168* (2013.01); *G03F 7/20* (2013.01); *G03F 7/32* (2013.01); *G03F 7/36* (2013.01); *C08G 2261/12* (2013.01); *C08G 2261/124* (2013.01); *C08G 2261/135* (2013.01); *C08G 2261/1424* (2013.01); *C08G 2261/3142* (2013.01); *C08G 2261/3162* (2013.01); *C08G 2261/344* (2013.01); *C08G 2261/3424* (2013.01); *C08G 2261/76* (2013.01)

(58) Field of Classification Search
CPC ... C08K 5/13; C08K 5/18; C08K 5/07; C08G 2261/12; C08G 2261/124; C08G 2261/135; C08G 2261/1424; G08C 2261/76; G03F 7/11; G03F 7/162
USPC .... 251/79.1, 79.2, 79.3, 79.4; 430/4, 5, 297, 430/302, 313
See application file for complete search history.

(56) References Cited

U.S. PATENT DOCUMENTS

| | | | | |
|---|---|---|---|---|
| 8,486,609 B2 * | 7/2013 | Rahman | ............... | C09D 165/00 430/271.1 |
| 8,507,726 B2 | 8/2013 | Studer et al. | | |
| 2006/0257762 A1 * | 11/2006 | Fujimori | ............... | G03F 7/0007 430/7 |
| 2013/0188270 A1 * | 7/2013 | Nishimae | .................. | C08F 2/50 359/885 |
| 2013/0280913 A1 * | 10/2013 | Shinjo | .................. | C09D 139/04 438/694 |

FOREIGN PATENT DOCUMENTS

| | | |
|---|---|---|
| CN | 101205291 A | 6/2008 |
| CN | 103229104 A | 7/2013 |
| CN | 103827159 A | 5/2014 |
| CN | 104067175 A | 9/2014 |
| JP | 3943522 B2 | 4/2007 |
| JP | 5141882 B2 | 11/2012 |
| JP | 5609882 B2 | 10/2014 |
| KR | 10-0861176 B1 | 9/2008 |
| KR | 10-2008-0107210 A | 12/2008 |
| KR | 10-2011-00868 12 A | 8/2011 |
| KR | 10-2015-0002953 A | 1/2015 |
| TW | 201446711 A | 12/2014 |
| WO | WO2012-050064 A1 | 4/2012 |
| WO | WO 2012/077640 A1 | 6/2012 |

OTHER PUBLICATIONS

Taiwanese Search Report dated Jun. 23, 2016 in Corresponding Taiwanese Patent Application No. 104141615.
Office Action dated Oct. 11, 2017 of the corresponding Chinese Patent Application No. 201510919236.X.

\* cited by examiner

*Primary Examiner* — Lan Vinh
(74) *Attorney, Agent, or Firm* — Lee & Morse, P.C.

(57) ABSTRACT

An organic layer composition, an organic layer, and a method of forming patterns, the composition including a polymer that includes a substituted or unsubstituted fluorene structure, an additive represented by Chemical Formula 1, and a solvent:

[Chemical Formula 1]

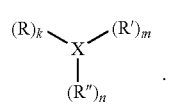

19 Claims, No Drawings

ORGANIC LAYER COMPOSITION, ORGANIC LAYER, AND METHOD OF FORMING PATTERNS

CROSS-REFERENCE TO RELATED APPLICATION

Korean Patent Applications No. 10-2015-0054584, filed on Apr. 17, 2015, and No. 10-2015-0139229, filed on Oct. 2, 2015, in the Korean Intellectual Property Office, and entitled: "Organic Layer Composition, Organic Layer, and Method of Forming Patterns," are incorporated by reference herein in its entirety.

BACKGROUND

1. Field

Embodiments relate to an organic layer composition, an organic layer manufactured using the organic layer composition, and a method of forming patterns using the organic layer composition.

2. Description of the Related Art

Recently, a high integration design in accordance with down-sizing (miniaturization) and complexity of an electronic device has accelerated development of a more advanced material and its related process, and accordingly, lithography using a photoresist may use new patterning materials and techniques. In a patterning process, an organic layer called as a hardmask layer may be formed as a hard interlayer to transfer the fine pattern of the photoresist down to a sufficient depth on a substrate without its collapse. The hardmask layer plays a role of an interlayer transferring the fine pattern of the photoresist to a material layer through a selective etching process.

SUMMARY

Embodiments are directed to an organic layer composition, an organic layer manufactured using the organic layer composition, and a method of forming patterns using the organic layer composition.

The embodiments may be realized by providing an organic layer composition including a polymer that includes a substituted or unsubstituted fluorene structure, an additive represented by Chemical Formula 1, and a solvent:

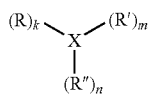

[Chemical Formula 1]

wherein, in Chemical Formula 1, k, m, and n are each independently 0 or 1, and a sum of k, m, and n is 2 or 3, when k+m+n=3, X is CH or nitrogen (N), when k+m+n=2, X is a direct bond, —$(C_qH_{2q})$—, —$(C_tR^w{}_{2t})$—, oxygen (O), sulfur (S), or —$S(O_2)$—, q and t being each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and R, R', and R" are each independently hydrogen, a hydroxy group, a substituted or unsubstituted C3 to C30 monovalent cyclic group, a substituted or unsubstituted C1 to C30 monovalent linear group, or a combination thereof.

The additive represented by Chemical Formula 1 may be represented by Chemical Formula 2-1 or 2-2:

[Chemical Formula 2-1]

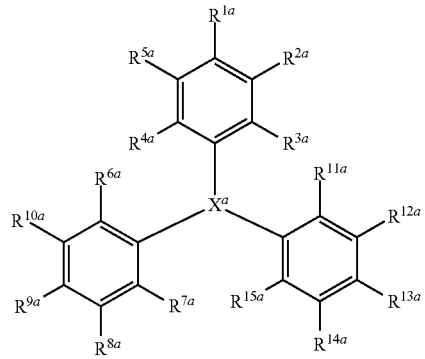

wherein, in Chemical Formula 2-1, $X^a$ may be CH or nitrogen (N), $R^{1a}$ to $R^{15a}$ are each independently hydrogen, a hydroxy group, or a group represented by one of the following Chemical Formulae A to C, and at least one of $R^{1a}$ to $R^{5a}$ is a group represented by one of Chemical Formulae A to C, at least one of $R^{6a}$ to $R^{10a}$ is a group represented by one of Chemical Formulae A to C, and at least one of $R^{11a}$ to $R^{15a}$ is a group represented by one of Chemical Formulae A to C,

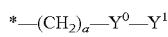
[Chemical Formula A]

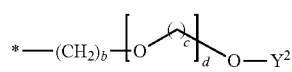
[Chemical Formula B]

[Chemical Formula C]

wherein, in Chemical Formulae A to C, a and b are each independently an integer of 0 to 10, c and d are each independently an integer of 1 to 10, $Y^0$ is oxygen, sulfur, or —$S(O_2)$—, $Y^1$ and $Y^2$ are each independently hydrogen, a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, $R^x$ to $R^z$ are each independently hydrogen, a hydroxy group, a substituted or unsubstituted C1 to C20 alkyl group, a substituted or unsubstituted C1 to C20 alkoxy group, a substituted or unsubstituted C6 to C30 aryl group, or a combination thereof, and * is a linking point,

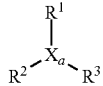   [Chemical Formula 2-2]

wherein, in Chemical Formula 2-2, $X_a$ may be CH or nitrogen (N), and $R^1$ to $R^3$ are each independently a group represented by one of Chemical Formulae A to C.

The additive represented by Chemical Formula 1 may include the additive represented by Chemical Formula 2-1, and in Chemical Formula 2-1, at least one of $R^{1a}$ to $R^{5a}$ may be a group represented by Chemical Formula A, at least one of $R^{6a}$ to $R^{10a}$ may be a group represented by Chemical Formula A, and at least one of $R^{11a}$ to $R^{15a}$ may be a group represented by Chemical Formula A.

In Chemical Formula A, a may be 1, $Y^0$ may be oxygen, and $Y^1$ may be a substituted or unsubstituted C1 to C20 alkyl group, a substituted or unsubstituted C2 to C20 alkenyl group, or a combination thereof.

The additive represented by Chemical Formula 1 may be represented by Chemical Formula 3-1 or 3-2:

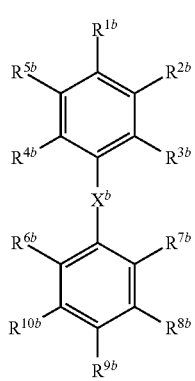   [Chemical Formula 3-1]

wherein, in Chemical Formula 3-1, $X^b$ may be a direct bond, $-(C_qH_{2q})-$, $-(C_tR^w{}_{2t})-$, oxygen (O), sulfur (S), or $-S(O_2)-$, q and t being each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and $R^{1b}$ to $R^{10b}$ are each independently hydrogen, a hydroxy group, or a group represented by one of Chemical Formulae A to C, $*-(CH_2)_a-Y^0-Y^1$   [Chemical Formula A]

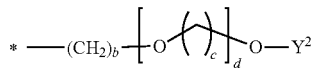   [Chemical Formula B]

$*-CR^xR^yR^z$   [Chemical Formula C]

wherein, in Chemical Formulae A to C, a and b are each independently an integer of 0 to 10, c and d are each independently an integer of 1 to 10, $Y^0$ may be oxygen, sulfur, or $-S(O_2)-$, $Y^1$ and $Y^2$ are each independently hydrogen, a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, $R^x$ to $R^z$ are each independently hydrogen, a hydroxy group, a substituted or unsubstituted C1 to C20 alkyl group, a substituted or unsubstituted C1 to C20 alkoxy group, a substituted or unsubstituted C6 to C30 aryl group, or a combination thereof, and * is a linking point, $R^1-X_b-R^2$   [Chemical Formula 3-2]

wherein, in Chemical Formula 3-2, $X_b$ is a direct bond, $-(C_qH_{2q})-$, $-(C_tR^w{}_{2t})-$, oxygen (O), sulfur (S), or $-S(O_2)-$, q and t being each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and $R^1$ and $R^2$ are each independently a group represented by one of Chemical Formulae A to C.

The additive represented by Chemical Formula 1 may include the additive represented by Chemical Formula 3-1, and in Chemical Formula 3-1, at least one of $R^{1b}$ to $R^{5b}$ may be a group represented by Chemical Formula A and at least one of $R^{6b}$ to $R^{10b}$ may be a group represented by Chemical Formula A.

In Chemical Formula A a may be 0 or 1, $Y^0$ may be oxygen, and $Y^1$ may be a substituted or unsubstituted C1 to C20 alkyl group, a substituted or unsubstituted C2 to C20 alkenyl group, or a combination thereof.

The additive represented by Chemical Formula 1 may include the additive represented by Chemical Formula 3-1, and in Chemical Formula 3-1, $X^b$ may be oxygen, at least one of $R^{1b}$ to $R^{5b}$ may be a group represented by Chemical Formula C, and at least one of $R^{6b}$ to $R^{10b}$ may be a group represented by Chemical Formula C.

In Chemical Formula C, at least one of $R^x$ to $R^z$ may be a hydroxy group.

The additive represented by Chemical Formula 1 may be represented by one of Chemical Formulae 1A to 1G:

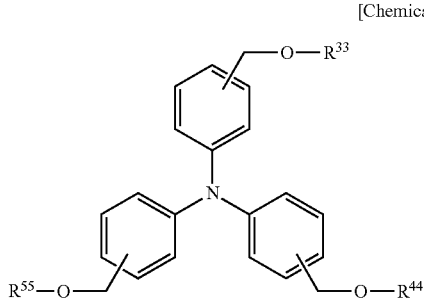
[Chemical Formula 1A]

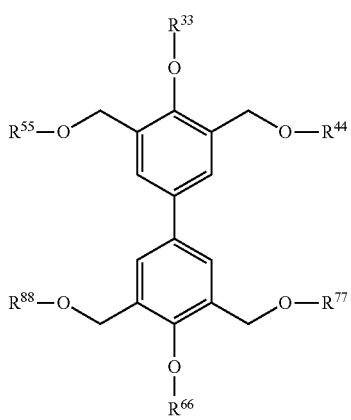
[Chemical Formula 1B]

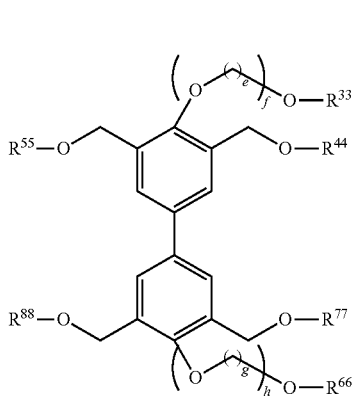
[Chemical Formula 1C]

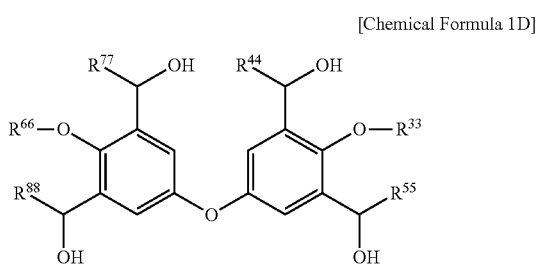
[Chemical Formula 1D]

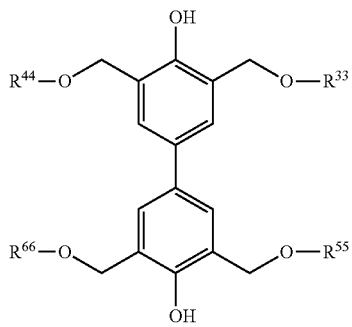
[Chemical Formula 1E]

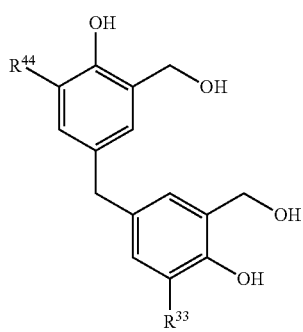
[Chemical Formula 1F]

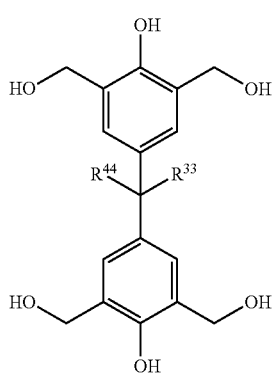
[Chemical Formula 1G]

wherein, in Chemical Formulae 1A to 1G, $R^{33}$, $R^{44}$, $R^{55}$, $R^{66}$, $R^{77}$, and $R^{88}$ are each independently substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and e, f, g, and h are each independently an integer of 1 to 10.

The polymer may include a moiety represented by Chemical Formula 4:

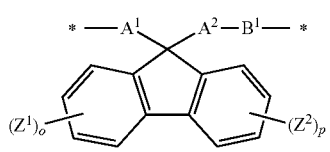

[Chemical Formula 4]

wherein, in Chemical Formula 4, $A^1$ and $A^2$ are each independently a substituted or unsubstituted aromatic cyclic group, $Z^1$ and $Z^2$ are each independently a hydroxy group, a substituted or unsubstituted C1 to C10 alkyl group, a substituted or unsubstituted C6 to C30 aryl group, a halogen atom, or a combination thereof, o and p are each independently an integer of 0 to 3, * is a linking point, and $B^1$ is one of the following groups, in which Me is a methyl group,

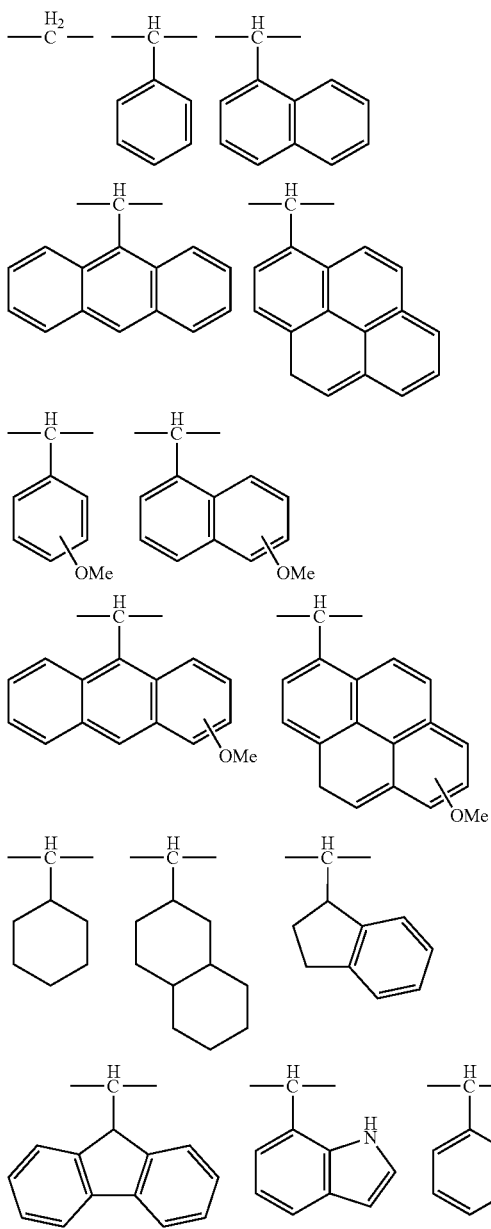

-continued

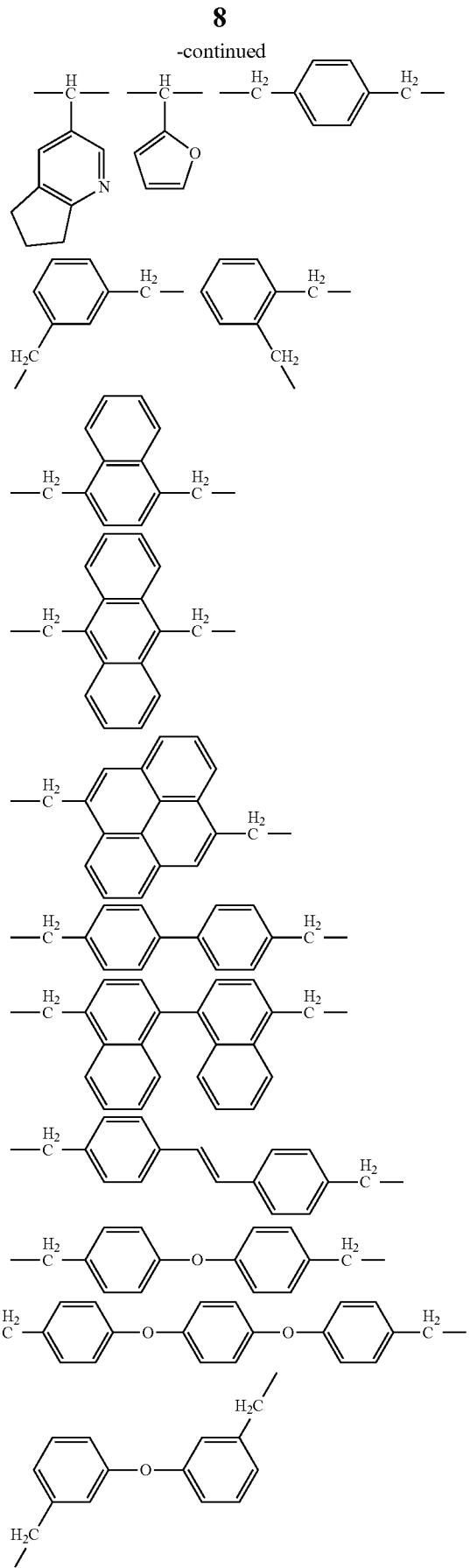

-continued

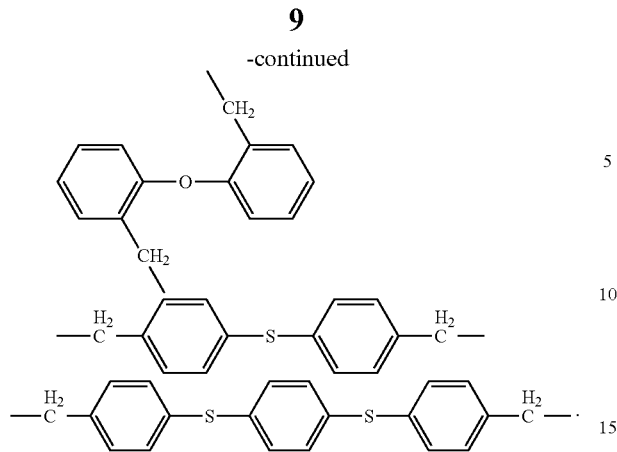

In Chemical Formula 4, $A^1$ and $A^2$ may each independently be a group including one or more benzene ring.

In Chemical Formula 4, $A^1$ and $A^2$ may each independently be a group substituted with a substituted or unsubstituted C1 to C20 alkoxy group or a hydroxy group.

In Chemical Formula 4, $A^1$ and $A^2$ may each independently be one of the following groups, in which $M^1$ and $M^2$ are each independently a hydroxy group, a substituted or unsubstituted C1 to C20 alkoxy group, or a combination thereof,

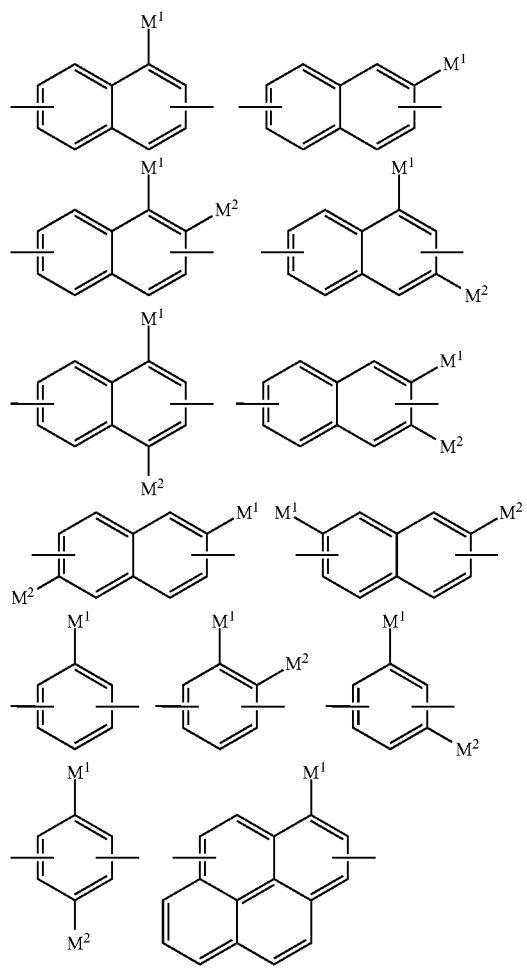

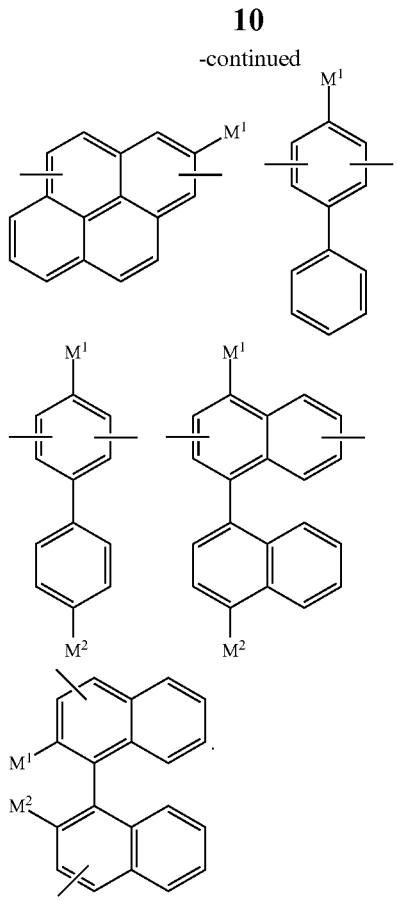

The additive represented by Chemical Formula 1 may have a molecular weight of about 150 to about 50,000.

The additive represented by Chemical Formula 1 may be present in the composition in an amount of about 0.1 wt % to about 50 wt %, based on a total weight of the organic layer composition.

The embodiments may be realized by providing an organic layer formed by curing the organic layer composition according to an embodiment.

The organic layer may include a hardmask layer.

The embodiments may be realized by providing a method of forming patterns, the method including providing a material layer on a substrate, applying the organic layer composition according to an embodiment on the material layer, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

Applying the organic layer composition may include performing a spin-on coating method.

The method may further include forming a bottom anti-reflective coating before forming the photoresist layer.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' refers to one including 1 to 3 heteroatoms selected from B, N, O, S, and P.

Hereinafter, an organic layer composition according to one embodiment is described.

An organic layer composition according to one embodiment may include, e.g., a polymer including a substituted or unsubstituted fluorene structure or moiety, an additive represented by Chemical Formula 1, and a solvent.

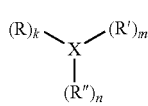

[Chemical Formula 1]

In Chemical Formula 1, k, m, and n may each independently be 0 or 1, and the sum of k, m and n may be 2 or 3, when k+m+n=3, X may be CH (e.g., a trivalent C1 group) or nitrogen (N), when k+m+n=2, X may be a direct bond, $-(C_qH_{2q})-$, $-(C_tR^w{}_{2t})-$, oxygen (O), sulfur (S), or $-S(O_2)-$, in which q and t may be each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and R, R', and R" may each independently be or include, e.g., hydrogen, a hydroxy group, a substituted or unsubstituted C3 to C30 monovalent cyclic group, a substituted or unsubstituted C1 to C30 monovalent linear group, or a combination thereof.

In an implementation, the C3 to C30 monovalent cyclic group may be, e.g., an alicyclic group or an aromatic cyclic group. The C1 to C30 monovalent linear group may be, e.g., a monovalent (non-cyclic) group containing 1 to 30 carbons. For example, the C1 to C30 monovalent linear group may not necessarily be a single linear chain of atoms, but may include branches, e.g., branched linear chains of atoms.

The organic layer composition may include a polymer having a predetermined structure and an additive together and thus may simultaneously secure etch resistance and gap-fill characteristics. Accordingly, an organic layer formed of the organic layer composition may have excellent layer density and planarization characteristics.

The polymer may include, e.g., a substituted or unsubstituted fluorene structure. In an implementation, the polymer may include, e.g., a moiety represented by Chemical Formula 4.

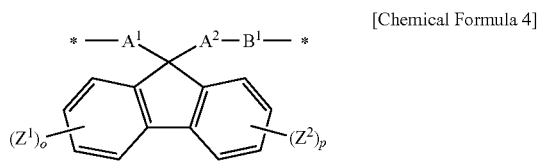

[Chemical Formula 4]

In Chemical Formula 4, $A^1$ and $A^2$ may each independently be or include, e.g., a substituted or unsubstituted aromatic cyclic group.

$Z^1$ and $Z^2$ may each independently be or include, e.g., a hydroxy group, a substituted or unsubstituted C1 to C10 alkyl group, a substituted or unsubstituted C6 to C30 aryl group, a halogen atom, or a combination thereof.

o and p may each independently be an integer ranging from 0 to 3. For example, when o and/or p is 0, the carbons of the benzene rings may be bound to hydrogen.

* is a linking point.

$B^1$ may be one of the following groups, in which Me is a methyl group.

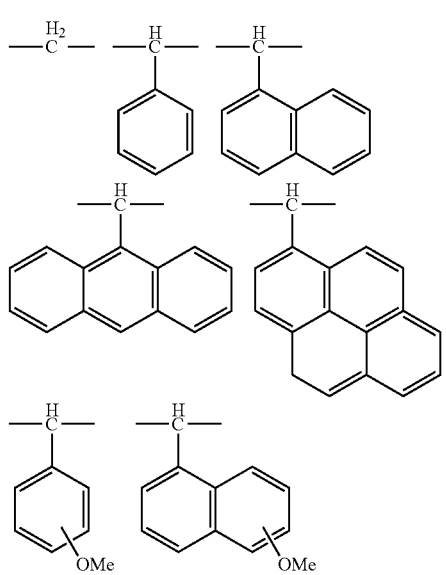

-continued

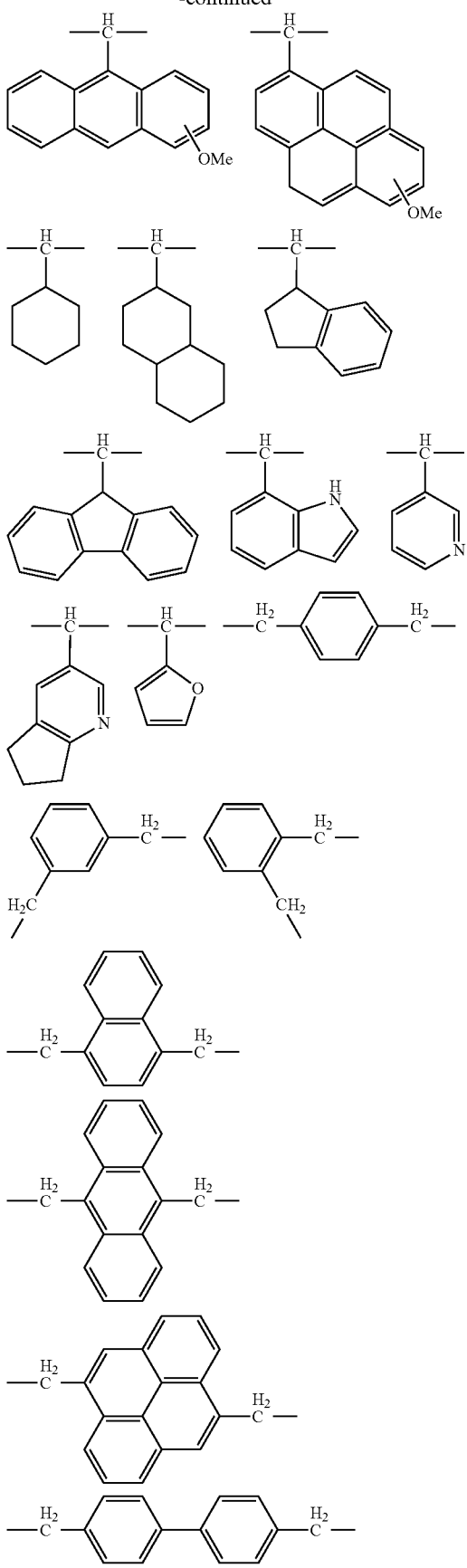

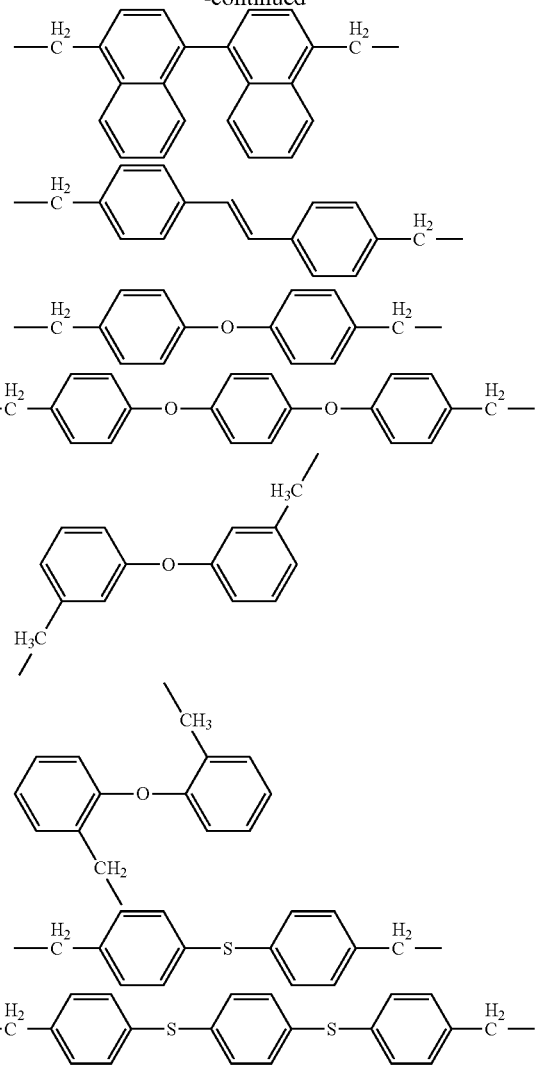

In an implementation, in Chemical Formula 4, $A^1$ and $A^2$ may each independently be a group including one or more benzene ring. In an implementation, in Chemical Formula 4, $A^1$ and $A^2$ may each independently be a group where at least one hydrogen is replaced by a hydroxy group or a substituted or unsubstituted C1 to C20 alkoxy group, e.g., may be a group that is substituted with a hydroxy group or a substituted or unsubstituted C1 to C20 alkoxy group.

In an implementation, $A^1$ and $A^2$ may each independently be one of the following groups.

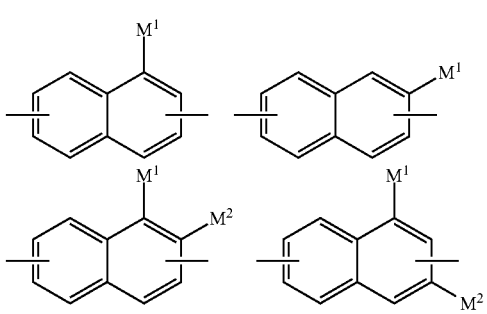

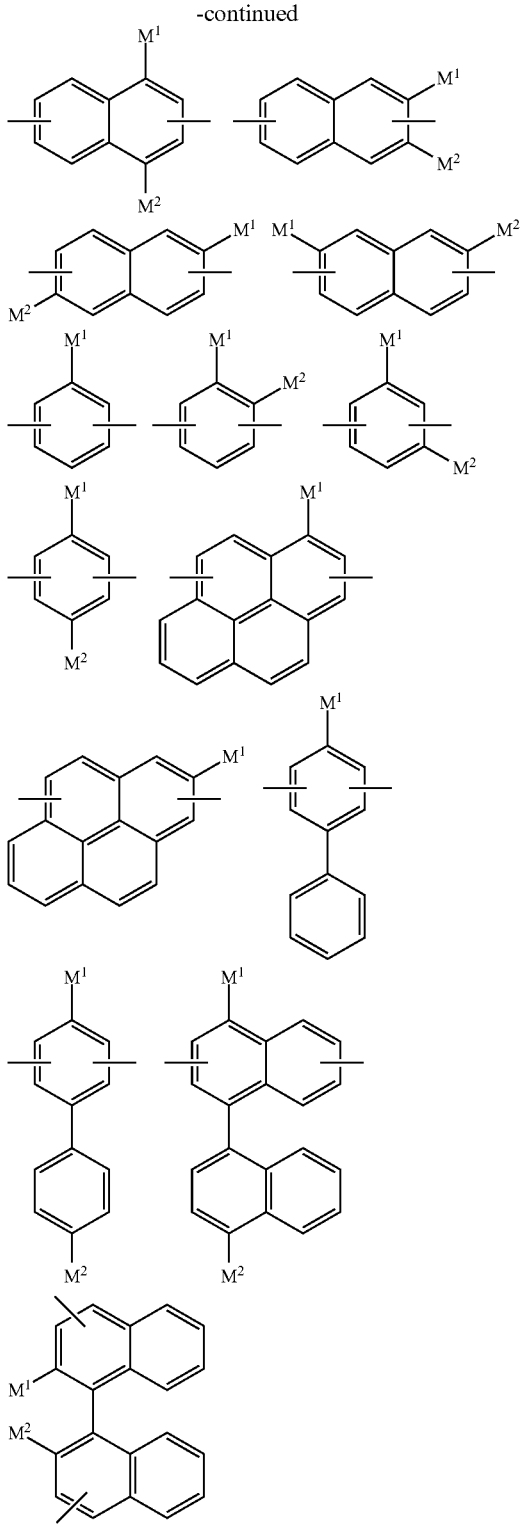

In the above groups, $M^1$ and $M^2$ may each independently be or include, e.g., a hydroxy group, a substituted or unsubstituted C1 to C20 alkoxy group, or a combination thereof.

The organic layer composition may have rigid characteristics by including the polymer having a specific structure, e.g., including the fluorene structure.

The polymer may include a plurality of moieties represented by Chemical Formula 4, and the moieties may have the same structure or different structures.

In an implementation, the organic layer composition may include the additive represented by Chemical Formula 1. The additive may include a plurality of compounds or moieties represented by Chemical Formula 1, and the compounds or moieties may have the same structure or may have different structures.

In an implementation, the additive represented by Chemical Formula 1 may have a structure that two or three benzene ring substituents are linked to a core represented by X. When the additive represented by Chemical Formula 1 has three of the benzene ring substituents, the core may be carbon or nitrogen, and when the additive has two of the benzene ring substituents, the core may be a direct bond, carbon, oxygen, sulfur, or $-SO_2-$.

In an implementation, when the additive has a structure in which three substituents are linked to the core, the additive may be represented by, e.g., one of Chemical Formula 2-1 or 2-2.

[Chemical Formula 2-1]

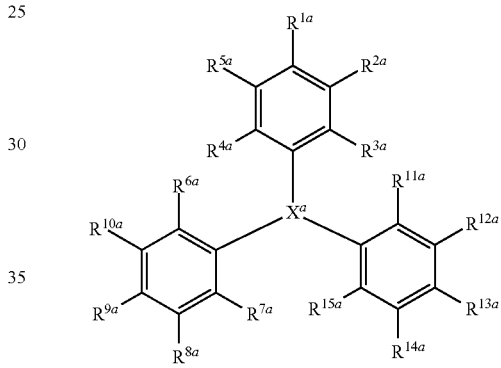

In Chemical Formula 2-1, $X^a$ may be, e.g., CH or nitrogen (N).

$R^{1a}$ to $R^{15a}$ may each independently be, e.g., hydrogen, a hydroxy group, or a group represented by one of Chemical Formulae A to C.

In an implementation, at least one of $R^{1a}$ to $R^{5a}$ may be a group represented by one of Chemical Formulae A to C, at least one of $R^{6a}$ to $R^{10a}$ may be a group represented by one of Chemical Formulae A to C, and at least one of $R^{11a}$ to $R^{15a}$ may be a group represented by one of Chemical Formulae A to C.

$$*-CH_{2a}-Y^0-Y^1 \quad \text{[Chemical Formula A]}$$

[Chemical Formula B]

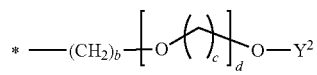

$$*-CR^xR^yR^z \quad \text{[Chemical Formula C]}$$

In Chemical Formulae A to C, a and b may each independently be, e.g., an integer of 0 to 10.

c and d may each independently be, e.g., an integer of 1 to 10.

$Y^0$ may be, e.g., oxygen, sulfur, or $-S(O_2)-$.

$Y^1$ and $Y^2$ may each independently be or include, e.g., hydrogen, a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof.

$R^x$ to $R^z$ may each independently be or include, e.g., hydrogen, a hydroxy group, a substituted or unsubstituted C1 to C20 alkyl group, a substituted or unsubstituted C1 to C20 alkoxy group, a substituted or unsubstituted C6 to C30 aryl group, or a combination thereof

* may be a linking point.

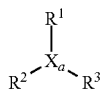   [Chemical Formula 2-2]

In Chemical Formula 2-2, $X_a$ may be, e.g., CH or nitrogen (N).

$R^1$ to $R^3$ may each independently be, e.g., a group represented by one of

Chemical Formulae A to C.

In an implementation, in Chemical Formula 2-1, at least one of $R^{1a}$ to $R^{5a}$ may be a group represented by Chemical Formula A, at least one of $R^{6a}$ to $R^{10a}$ may be a group represented by Chemical Formula A, and at least one of $R^{11a}$ to $R^{15a}$ may be a group represented by Chemical Formula A. In an implementation, in Chemical Formula A, $Y^0$ may be, e.g., oxygen, and $Y^1$ may be or may include, e.g., a substituted or unsubstituted C1 to C20 alkyl group, a substituted or unsubstituted C2 to C20 alkenyl group, or a combination thereof In an implementation, the additive having a structure where a core is linked to two substituents may be represented by, e.g., Chemical Formula 3-1 or 3-2.

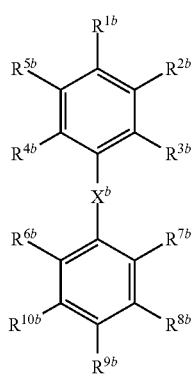   [Chemical Formula 3-1]

In Chemical Formula 3-1, $X^b$ may be, e.g., a direct bond, $-(C_qH_{2q})-$, $-(C_tR^w_{2t})-$, oxygen (O), sulfur (S), or $-S(O_2)-$, in which q and t may be each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof.

$R^{1b}$ to $R^{10b}$ may each independently be, e.g., hydrogen, a hydroxy group, or a group represented by one of Chemical Formulae A to C.

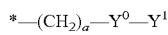   [Chemical Formula A]

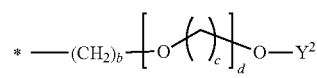   [Chemical Formula B]

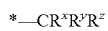   [Chemical Formula C]

In Chemical Formulae A to C, the variable groups may be the same as described above.

a and b may each independently be, e.g., an integer of 0 to 10.

c and d may each independently be, e.g., an integer of 1 to 10.

$Y^0$ may be, e.g., oxygen, sulfur, or $-S(O_2)-$.

$Y^1$ and $Y^2$ may each independently be or include, e.g., hydrogen, a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof.

$R^x$ to $R^z$ may each independently be or include, e.g., hydrogen, a hydroxy group, a substituted or unsubstituted C1 to C20 alkyl group, a substituted or unsubstituted C1 to C20 alkoxy group, a substituted or unsubstituted C6 to C30 aryl group, or a combination thereof

* may be a linking point.

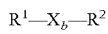   [Chemical Formula 3-2]

In Chemical Formula 3-2, $X_b$ may be, e.g., a direct bond, $-(C_qH_{2q})-$, $-(C_tR^w_{2t})-$, oxygen (O), sulfur (S), or $-S(O_2)-$, in which q and t may be each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, $R^1$ and $R^2$ may each independently be, e.g., a group represented by one of Chemical Formulae A to C.

In an implementation, in Chemical Formula 3-1, at least one of $R^{1b}$ to $R^{5b}$ may be a group represented by Chemical Formula A and at least one of the $R^{6b}$ to $R^{10b}$ may be a group represented by Chemical Formula A. In an implementation, when at least one of the $R^{1b}$ to $R^{5b}$ is a group represented by Chemical Formula A and at least one of the $R^{6b}$ to $R^{10b}$ is a group represented by Chemical Formula A, a may be 0 or 1, $Y^0$ may be oxygen, and $Y^1$ may be or include a substituted or unsubstituted C1 to C20 alkyl group, a substituted or unsubstituted C2 to C20 alkenyl group, or a combination thereof In an implementation, in Chemical Formula 3-1, the $X^b$ may be oxygen, at least one of the $R^{1b}$ to $R^{5b}$ may be a group represented by Chemical Formula C, and at least one of the $R^{6b}$ to $R^{10b}$ may be a group represented by Chemical Formula C. In an implementation, in Chemical Formula C, at least one of $R^x$ to $R^z$ may be a hydroxy group, and at least one of $R^x$ to $R^z$ may be a substituted or unsubstituted C1 to C20 alkyl group.

In an implementation, the additive represented by Chemical Formula 1 may be represented by, e.g., one of the following Chemical Formulae 1A to 1G.

[Chemical Formula 1A]

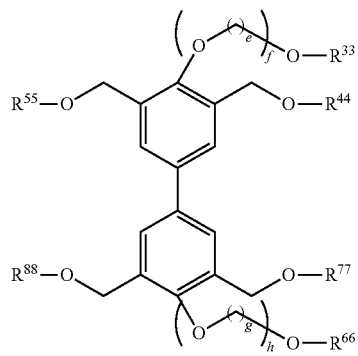

[Chemical Formula 1B]

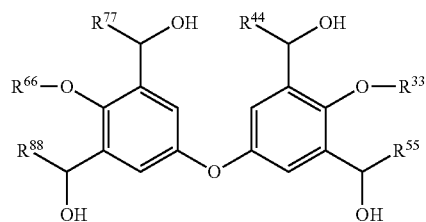

[Chemical Formula 1C]

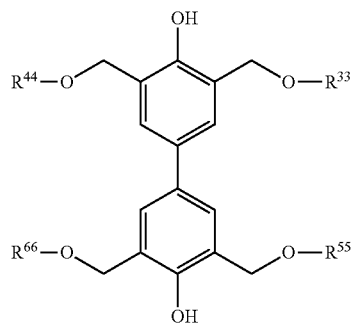

[Chemical Formula 1D]

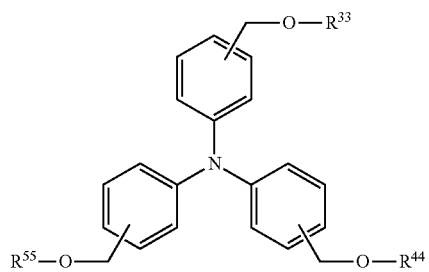

[Chemical Formula 1E]

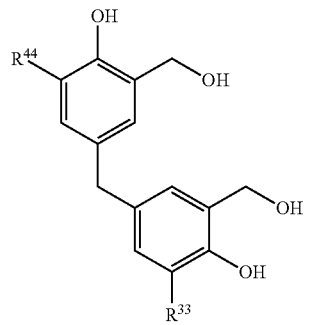

[Chemical Formula 1F]

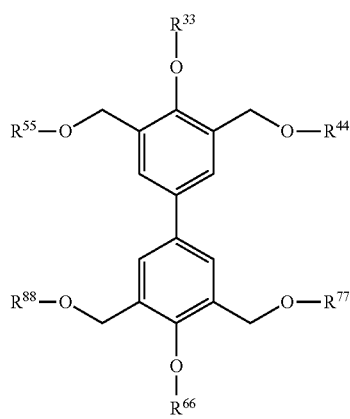

[Chemical Formula 1G]

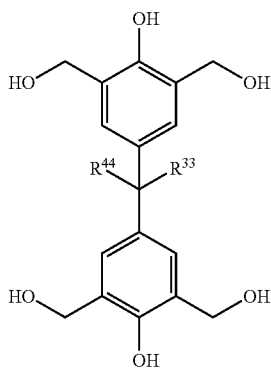

In Chemical Formulae 1A to 1G, $R^{33}$ to $R^{88}$ (e.g., $R^{33}$, $R^{44}$, $R^{55}$, $R^{66}$, $R^{77}$, and $R^{88}$) may each independently be or include, e.g., substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof e, f, g, and h may each independently be, e.g., an integer of 1 to 10.

In an implementation, the compound represented by Chemical Formula 1E may be, e.g., a compound represented by Chemical Formula 1E', the compound represented by Chemical Formula 1F may be, e.g., a compound represented by Chemical Formula 1F', and/or the compound represented by Chemical Formula 1G may be, e.g., a compound represented by Chemical Formula 1G'.

[Chemical Formula 1E']

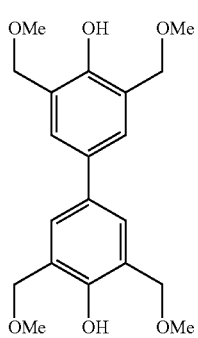

[Chemical Formula 1F']

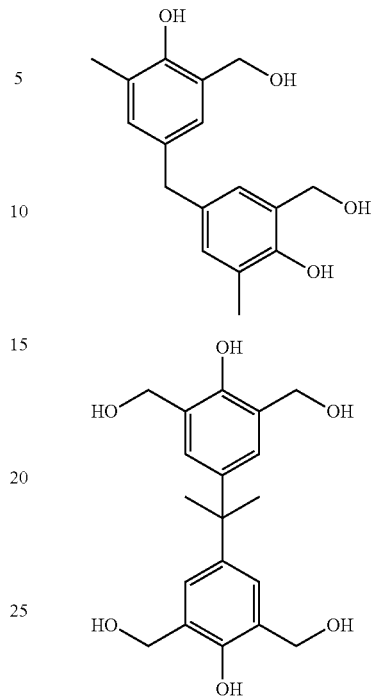

[Chemical Formula 1G']

The organic layer composition may include an additive having this structure, and thus may help increase the crosslinking region of a polymer having the fluorene structure, may help decrease viscosity of the organic layer composition, and resultantly may improve initial planarity of an organic layer. In an implementation, the polymer may have a molecular weight of, e.g., about 150 to about 50,000. Within the ranges, a carbon content and solubility in a solvent of the organic layer composition (e.g., a hardmask composition) including the polymer may be optimized. In an implementation, the additive may have a molecular weight of, e.g., about 150 to about 50,000.

The solvent may be a suitable solvent having sufficient dissolubility or dispersion for the polymer and may be, e.g., at least one selected from propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyllactate, gamma-butyrolactone, N,N-dimethyl formamide, N,N-dimethyl acetamide, methylpyrrolidone, methylpyrrolidinone, acetylacetone, and ethyl 3-ethoxypropionate.

The polymer may be present in the composition in an amount of about 0.1 to about 50 wt %, based on a total weight of the organic layer composition. When the polymer is included in the range, a thickness, surface roughness, and planarization of the organic layer may be controlled.

The additive may be present in the composition in an amount of about 0.1 to about 50 wt %, based on the total weight of the organic layer composition. When the additive is included within the range, initial planarization of an organic layer may be improved.

In an implementation, the organic layer composition may further include another additive, e.g., a surfactant, a thermal acid generator, or a plasticizer.

The surfactant may include, e.g., alkylbenzene sulfonate salt, alkyl pyridinium salt, polyethylene glycol, or a quaternary ammonium salt.

The thermal acid generator may include, e.g., an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

Another embodiment may provide an organic layer manufactured using the organic layer composition. The organic layer may be, e.g., formed by coating the organic layer composition on a substrate and heat-treating it for curing and may include, for example, a hardmask layer, a planarization layer, a sacrificial layer, a filler, and the like for an electronic device.

Hereafter, a method for forming patterns by using the organic layer composition is described.

A method of forming patterns according to one embodiment may include, e.g., providing a material layer on a substrate, applying the organic layer composition, heat-treating the organic layer composition to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer may be a material to be finally patterned, e.g., a metal layer such as an aluminum layer and a copper layer, a semiconductor layer such as a silicon layer, or an insulation layer such as a silicon oxide layer and a silicon nitride layer. The material layer may be formed through a suitable method, e.g., a chemical vapor deposition (CVD) process.

The organic layer composition may be the same as described above, and may be applied by spin-on coating in a form of a solution. In an implementation, a thickness of the organic layer composition may be, e.g., about 50 Å to about 10,000 Å.

The heat-treating of the organic layer composition may be performed, e.g., at about 100 to about 500° C. for about 10 seconds to about 1 hour.

The silicon-containing thin layer may be formed of, e.g., SiCN, SiOC, SiON, SiOCN, SiC, SiN, and/or the like.

In an implementation, the method may further include forming a bottom antireflective coating (BARC) before forming the photoresist layer on the silicon-containing thin layer.

Exposure of the photoresist layer may be performed using, e.g., ArF, KrF, or EUV. After exposure, heat treatment may be performed at about 100° C. to about 500° C.

The etching process of the exposed part of the material layer may be performed through a dry etching process using an etching gas and the etching gas may be, e.g., $CHF_3$, $CF_4$, $Cl_2$, $BCl_3$, or a mixed gas thereof The etched material layer may be formed in a plurality of pattern, and the plurality of pattern may be, e.g., a metal pattern, a semiconductor pattern, an insulation pattern, or the like, for example diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Polymer Synthesis

Synthesis Example 1a 21.6 g (0.057 mol) of 9,9-bis(4-methoxyphenyl)-9H-fluorene and 9.6 g (0.057 mol) of 1,4-bis(methoxymethyl)benzene were sequentially put in a 500 ml flask equipped with a thermometer, a condenser, and a mechanical agitator and dissolved in 51 g of propylene glycolmonomethylether acetate (PGMEA). Next, 0.15 g (0.001 mol) of diethylsulfite was added thereto, and the mixture was agitated at 90 to 120° C. for 5 to 10 hours. Then, a sample was taken from the obtained polymerization reactant by every hour, and the reaction was completed, when the specimen reached a weight average molecular weight ranging from 1,800 to 2,300.

When the polymerization reaction was complete, the reactant was subsequently cooled down to ambient temperature and added to 40 g of distilled water and 400 g of methanol, and the mixture was fervently agitated and allowed to stand. After removing a supernatant therefrom, a precipitate obtained therefrom was dissolved in 80 g of propylene glycol monomethylether acetate (PGMEA), and 40 g of methanol and 40 g of water were added thereto, and the mixture was allowed to stand (First). After removing a supernatant obtained therefrom was removed again, a precipitate obtained therefrom was dissolved in 40 g of propylene glycol monomethylether acetate (PGMEA) (Second). The first and second processes were regarded as one purification process, and this purification process was repeated three times in total. The purified polymer was dissolved in 80 g of propylene glycolmonomethylether acetate (PGMEA), and methanol and distilled water remaining in the solution were removed under a reduced pressure, obtaining a compound including a moiety represented by Chemical Formula 1a (a weight average molecular weight (Mw)=2,500).

[Chemical Formula 1a]

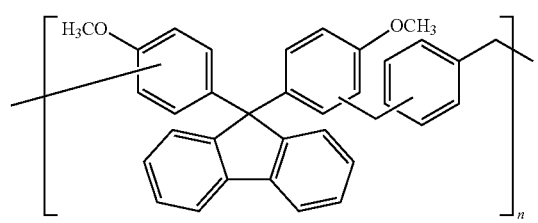

Additive Synthesis

Synthesis Example 1b 5 g (20.38 mmol) of triphenylamine was dissolved in 30 g of dimethyl formamide (DMF) in a flask, 11.97 g (67.23 mmol) of N-bromosuccinimide was added in a dropwise fashion, and the mixture was agitated at ambient temperature for 12 hours. The resultant was extracted with dichloromethane (DCM), and a product obtained after removing a solvent therefrom was separated through column chromatography, obtaining the following compound S1.

[Compound S1]

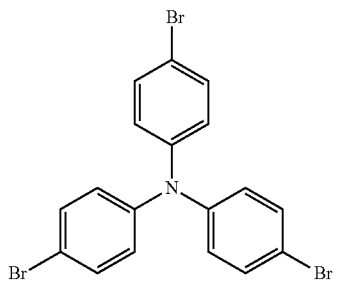

0.5 g (1.04 mmol) of the compound S1 was dissolved in 5 mL of tetrahydrofuran (THF) in a flask, and 2.3 mL (3.64 mmol) of 1.6 M n-BuLi in hexane was slowly added thereto in a dropwise fashion at −78° C. Subsequently, 0.65 g (5.2 mmol) of bromomethylmethylether was added in a dropwise fashion, and the mixture was slowly heated and agitated for 1 hour and 30 minutes. The resultant was quenched with an $NH_4Cl$ solution and extracted with EtOAc, a product obtained after removing a solvent therefrom was separated through column chromatography, obtaining a compound represented by Chemical Formula 1b.

[Chemical Formula 1b]

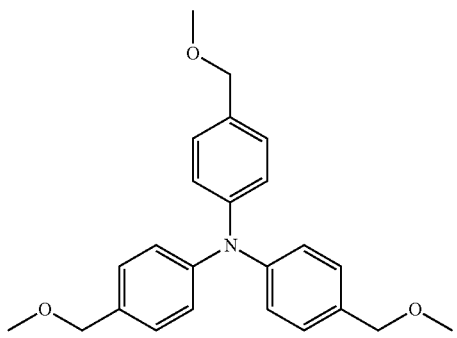

Synthesis Example 2b 3 g (8.27 mmol) of 3,3',5,5'-tetrakis(methoxymethyl)-[1,1'-Biphenyl]-4,4'-diol was dissolved in 30 g of DMF, 0.83 g (20.75 mmol) of 60% NaH in mineral oil was added thereto in a dropwise fashion at 0° C., and 2.93 g (20.64 mmol) of MeI was additionally added thereto in a dropwise fashion. The resulting mixture was agitated at ambient temperature for 12 hours, an $NH_4Cl$ solution was added thereto, EtOAc was used for extraction, and a solvent was removed therefrom. A product obtained therefrom was separated through column chromatography, obtaining a compound represented by Chemical Formula 2b.

[Chemical Formula 2b]

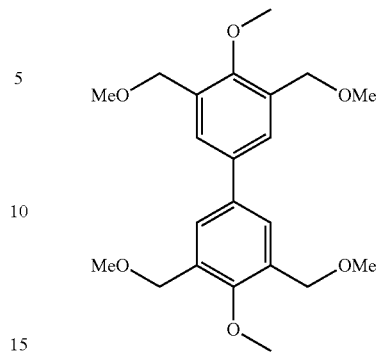

Synthesis Example 3b 3 g (13.02 mmol) of 1,1'-oxybis[4-methoxy-benzene] was dissolved in 50 mL of DCM, and 8 g (60 mmol) of $AlCl_3$ was added thereto in a dropwise fashion 0° C. Then, 4.71 g (60 mmol) of acetylchloride was additionally added thereto in a dropwise fashion, and the mixture was agitated at ambient temperature for 12 hours. Subsequently, a HCl solution was added thereto, DCM was used for extraction, and a solvent was removed therefrom. A product therefrom was purified through column chromatography, obtaining the following compound S2.

[Compound S2]

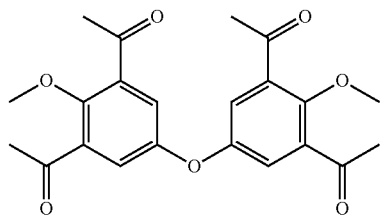

3 g (7.52 mmol) of the compound S2 was dissolved in 50 g of anhydrous THF, 1.138 g (30 mmol) of lithium aluminum hydride was added thereto in a dropwise fashion at 0° C., and the mixture was agitated at ambient temperature for 2 hours. Then, 6N NaOH was added thereto, the mixture was treated with EtOAc for extraction, and a solvent was removed therefrom. A product therefrom was purified through column chromatography, obtaining a compound represented by Chemical Formula 3b.

[Chemical Formula 3b]

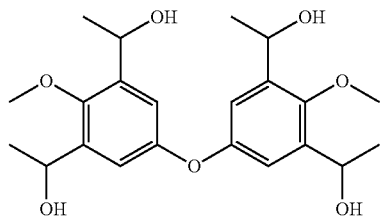

Synthesis Example 4b 3 g (8.27 mmol) of 3,3',5,5'-tetrakis(methoxymethyl)-[1,1'-biphenyl]-4,4'-diol was dissolved in 30 g of DMF, 0.83 g (20.75 mmol) of 60% NaH in mineral oil was added thereto in a dropwise fashion at 0° C., and 2.50 g (20.69 mmol) of allyl bromide was additionally added thereto in a dropwise fashion. The mixture was agitated for 12 hours at ambient temperature, an NH₄Cl solution was added thereto, the obtained mixture was extracted with EtOAc, and a solvent was removed therefrom. Then, a product was purified through column chromatography, obtaining a compound represented by Chemical Formula 4b.

[Chemical Formula 4b]

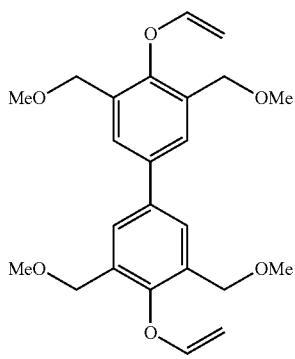

Synthesis Example 5b 3 g (8.27 mmol) of 3,3',5,5'-tetrakis(methoxymethyl)-[1,1'-biphenyl]-4,4'-diol was dissolved in 30 g of DMF, 0.83 g (20.75 mmol) of 60% NaH in mineral oil was added thereto in a dropwise fashion at 0° C., and 8.55 g (27.02 mmol) of diethylene tosylate butyl ether was additionally added thereto in a dropwise fashion. The resulting mixture was agitated for 12 hours at ambient temperature, an NH₄Cl solution was added thereto, and the obtained mixture was extracted with EtOAc, and a solvent was removed therefrom. Then, a product therefrom was purified through column chromatography, obtaining represented by Chemical Formula 5b.

[Chemical Formula 5b]

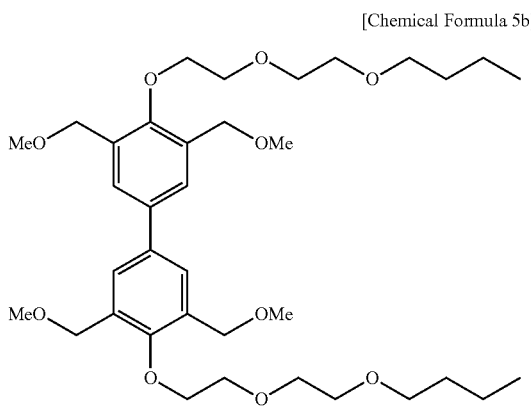 [SMILES: CCCCOCCOCCOc1c(COC)cc(-c2cc(COC)c(OCCOCCOCCCC)c(COC)c2)cc1COC]

Preparation of Hardmask Composition

Example 1

The polymer obtained according to Synthesis Example 1a, an additive represented by Synthesis Example 1b, and p-toluenesulfonic acid as a thermal acid generator were dissolved in a propylene glycol monomethyl ether acetate (PGMEA) solvent, preparing a hardmask composition.

The polymer, the additive, and the thermal acid generator were respectively used in an amount of about 70 wt %, about 29.9 wt %, and about 0.1 wt % based on the total weight of the hardmask composition.

Example 2

A hardmask composition was prepared according to the same method Example 1 as except for using the additive according to Synthesis Example 2b instead of the additive according to Example 1b.

Example 3

A hardmask composition was prepared according to the same method Example 1 as except for using the additive according to Synthesis Example 3b instead of the additive according to Example 1b.

Example 4

A hardmask composition was prepared according to the same method Example 1 as except for using the additive according to Synthesis Example 4b instead of the additive according to Example 1b.

Example 5

A hardmask composition was prepared according to the same method Example 1 as except for using the additive according to Synthesis Example 5b instead of the additive according to Example 1b.

Example 6

A hardmask composition was prepared according to the same method Example 1 as except for using an additive represented by Chemical Formula 6b (TMOM-BP, SAMC-HUN Pure chemical co. LTD) instead of the additive according to Example 1b.

[Chemical Formula 6b]

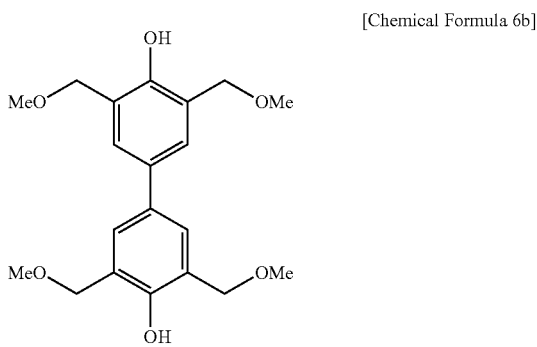 [SMILES: COCc1cc(-c2cc(COC)c(O)c(COC)c2)cc(COC)c1O]

Comparative Example 1

A hardmask composition was prepared according to the same method as Example 1 except for using no additive.

Evaluation 1: Planarization Characteristics

Each hardmask composition according to Examples 1 to 6 and Comparative Example 1 was spun-on coated on a patterned silicon wafer and heat-treated at 400° C. for 2 minutes to form a thin film. Subsequently, planarization characteristics of the thin film were examined by using a scanning electron microscope (SEM).

When the thin film had a rectangular pattern shape, it was evaluated as A, and when the thin film had a shape other than the rectangular shape, it was evaluated as B.

TABLE 1

| | Polymer | Additive | Planarization |
|---|---|---|---|
| Example 1 | Chemical Formula 1a | Chemical Formula 1b | A |
| Example 2 | Chemical Formula 1a | Chemical Formula 2b | A |
| Example 3 | Chemical Formula 1a | Chemical Formula 3b | A |
| Example 4 | Chemical Formula 1a | Chemical Formula 4b | A |
| Example 5 | Chemical Formula 1a | Chemical Formula 5b | A |
| Example 6 | Chemical Formula 1a | Chemical Formula 6b | A |
| Comparative Example 1 | Chemical Formula 1a | None | B |

Referring to Table 1, the hardmask compositions according to Examples 1 to 6 exhibited excellent gap-fill characteristics and thus excellent planarization characteristics, compared with the hardmask composition according to Comparative Example 1.

By way of summation and review, a hardmask layer may exhibit characteristics such as heat resistance, etch resistance, and the like to endure multi-etching processes. A spin-on coating method instead of a chemical vapor deposition (CVD) method has been considered to form the hardmask layer. The spin-on coating method may not only be easily performed but may also improve gap-fill characteristics and planarization characteristics. Heat resistance and etch resistance may have trade-off relationship with spin-on characteristics, and an organic layer material may satisfy all the characteristics.

The embodiments may provide an organic layer composition capable of improving gap-fill characteristics and planarization characteristics as well as etch resistance.

The embodiments may provide an organic layer having improved etch resistance and film planarity.

The organic layer composition may help improve etch resistance and solubility simultaneously, e.g., due to the polymer and the additive.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An organic layer composition, comprising:
a polymer that includes a substituted or unsubstituted fluorene structure,
an additive represented by Chemical Formula 2-1, Chemical Formula 2-2, Chemical Formula 3-1, or Chemical Formula 3-2, and a solvent:

[Chemical Formula 2-1]

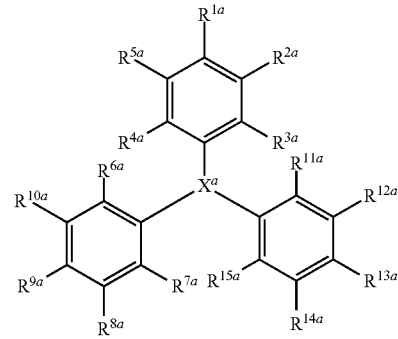

wherein, in Chemical Formula 2-1,
$X^a$ is CH or nitrogen (N),
$R^{1a}$ to $R^{15a}$ are each independently hydrogen, a hydroxy group, or a group represented by one of the following Chemical Formulae A to C, and
at least one of $R^{1a}$ to $R^{5a}$ is a group represented by one of Chemical Formulae A to C, at least one of $R^{6a}$ to $R^{10a}$ is a group represented by one of Chemical Formulae A to C, and at least one of $R^{11a}$ to $R^{15a}$ is a group represented by one of Chemical Formulae A to C,

[Chemical Formula 2-2]

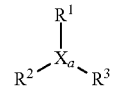

wherein, in Chemical Formula 2-2,
$X_a$ is CH or nitrogen (N), and
$R^1$ to $R^3$ are each independently a group represented by one of Chemical Formulae A to C,

[Chemical Formula 3-1]

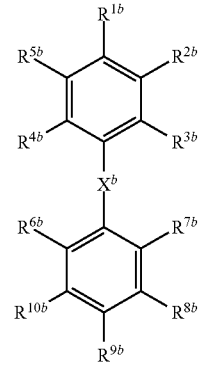

wherein, in Chemical Formula 3-1,
$X^b$ is a direct bond, $-(C_qH_{2q})-$, $-(C_rR^w{}_{2t})-$, oxygen (O), sulfur (S), or $-S(O_2)-$, q and t being each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and $R^{1b}$ to $R^{10b}$ are each independently hydrogen, a hydroxy group, or a group represented by one of Chemical Formulae A to C, $$R^1-X_b-R^2 \quad \text{[Chemical Formula 3-2]}$$

wherein, in Chemical Formula 3-2, $X_b$ is a direct bond, $-(C_qH_{2q})-$, $-(C_tR^w{}_{2t})-$, oxygen (O), sulfur (S), or $-S(O_2)-$, q and t being each independently an integer of 1 to 5, and $R^w$ being a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C30 arylalkyl group, a C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and $R^1$ and $R^2$ are each independently a group represented by one of Chemical Formulae A to C, $$*-(CH_2)_a-Y^0-Y^1 \quad \text{[Chemical Formula A]}$$

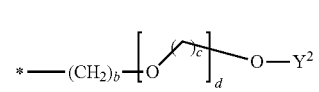

[Chemical Formula B]

$$*-CR^xR^yR^z \quad \text{[Chemical Formula C]}$$

wherein, in Chemical Formulae A to C, a and b are each independently an integer of 0 to 10, c and d are each independently an integer of 1 to 10, $Y^0$ is oxygen, sulfur, or $-S(O_2)-$, $Y^1$ and $Y^2$ are each independently hydrogen, a substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, $R^x$ to $R^z$ are each independently hydrogen, a hydroxy group, a substituted or unsubstituted C1 to C20 alkyl group, a substituted or unsubstituted C1 to C20 alkoxy group, a substituted or unsubstituted C6 to C30 aryl group, or a combination thereof, and

* is a linking point.

2. The organic layer composition as claimed in claim 1, wherein the additive is represented by one of Chemical Formulae 1A to 1G:

[Chemical Formula 1A]

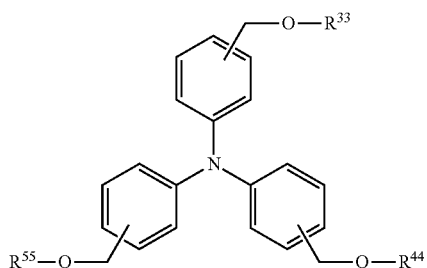

[Chemical Formula 1B]

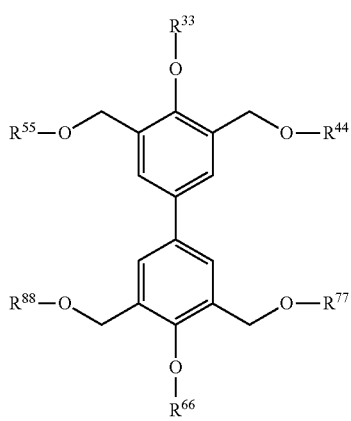

[Chemical Formula 1C]

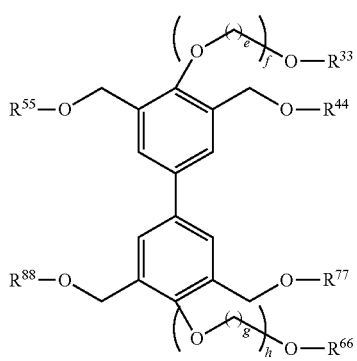

[Chemical Formula 1D]

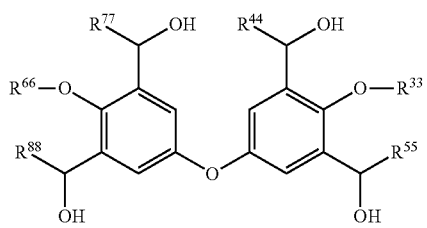

-continued

[Chemical Formula 1E]

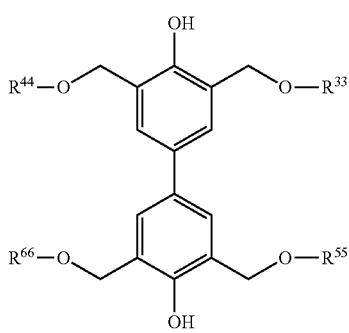

[Chemical Formula 1F]

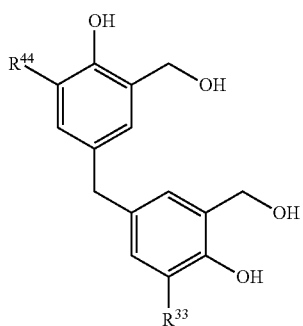

[Chemical Formula 1G]

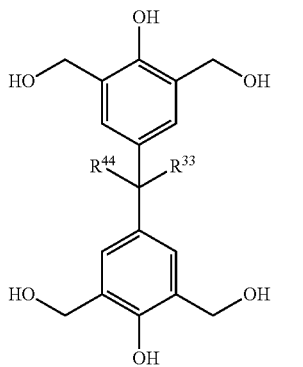

wherein, in Chemical Formulae 1A to 1G,
$R^{33}$, $R^{44}$, $R^{55}$, $R^{66}$, $R^{77}$, and $R^{88}$ are each independently substituted or unsubstituted C1 to C20 alkyl group, a substituted or unsubstituted C6 to C30 aryl group, a substituted or unsubstituted C3 to C30 cycloalkenyl group, a substituted or unsubstituted C1 to C20 alkylamine group, a substituted or unsubstituted C7 to C20 arylalkyl group, a substituted or unsubstituted C1 to C20 heteroalkyl group, a substituted or unsubstituted C2 to C30 heterocycloalkyl group, a substituted or unsubstituted C2 to C30 heteroaryl group, a substituted or unsubstituted C1 to C4 alkyl ether group, a substituted or unsubstituted C7 to C20 arylalkylene ether group, a substituted or unsubstituted C1 to C30 haloalkyl group, a substituted or unsubstituted C2 to C20 alkenyl group, or a combination thereof, and
e, f, g, and h are each independently an integer of 1 to 10.

3. The organic layer composition as claimed in claim 1, wherein the additive represented by Chemical Formula 1 has a molecular weight of about 150 to about 50,000.

4. The organic layer composition as claimed in claim 1, wherein the additive represented by Chemical Formula 1 is present in the composition in an amount of about 0.1 wt % to about 50 wt %, based on a total weight of the organic layer composition.

5. The organic layer composition as claimed in claim 1, wherein:
the additive is represented by Chemical Formula 2-1, and in Chemical Formula 2-1, at least one of $R^{1a}$ to $R^{5a}$ is a group represented by Chemical Formula A, at least one of $R^{6a}$ to $R^{10a}$ is a group represented by Chemical Formula A, and at least one of $R^{11a}$ to $R^{15a}$ is a group represented by Chemical Formula A.

6. The organic layer composition as claimed in claim 5, wherein, in Chemical Formula A:
a is 1,
$Y^0$ is oxygen, and
$Y^1$ is a substituted or unsubstituted C1 to C20 alkyl group, a substituted or unsubstituted C2 to C20 alkenyl group, or a combination thereof.

7. The organic layer composition as claimed in claim 1, wherein:
the additive is represented by Chemical Formula 3-1, and in Chemical Formula 3-1, at least one of $R^{1b}$ to $R^{5b}$ is a group represented by Chemical Formula A and at least one of $R^{6b}$ to $R^{10b}$ is a group represented by Chemical Formula A.

8. The organic layer composition as claimed in claim 7, wherein, in Chemical Formula A:
a is 0 or 1,
$Y^0$ is oxygen, and
$Y^1$ is a substituted or unsubstituted C1 to C20 alkyl group, a substituted or unsubstituted C2 to C20 alkenyl group, or a combination thereof.

9. The organic layer composition as claimed in claim 1, wherein:
the additive is represented by Chemical Formula 3-1, and in Chemical Formula 3-1,
$X^b$ is oxygen,
at least one of $R^{1b}$ to $R^{5b}$ is a group represented by Chemical Formula C, and
at least one of $R^{1b}$ to $R^{10b}$ is a group represented by Chemical Formula C.

10. The organic layer composition as claimed in claim 9, wherein, in Chemical Formula C, at least one of $R^x$ to $R^z$ is a hydroxy group.

11. An organic layer formed by curing the organic layer composition as claimed in claim 1.

12. The organic layer as claimed in claim 11, wherein the organic layer includes a hardmask layer.

13. The organic layer composition as claimed in claim 1, wherein the polymer includes a moiety represented by Chemical Formula 4:

[Chemical Formula 4]

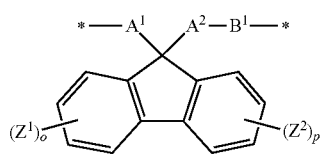

wherein, in Chemical Formula 4,
$A^1$ and $A^2$ are each independently a substituted or unsubstituted aromatic cyclic group,
$Z^1$ and $Z^2$ are each independently a hydroxy group, a substituted or unsubstituted C1 to C10 alkyl group, a substituted or unsubstituted C6 to C30 aryl group, a halogen atom, or a combination thereof,
o and p are each independently an integer of 0 to 3,
* is a linking point, and $B^1$ is one of the following groups, in which Me is a methyl group,
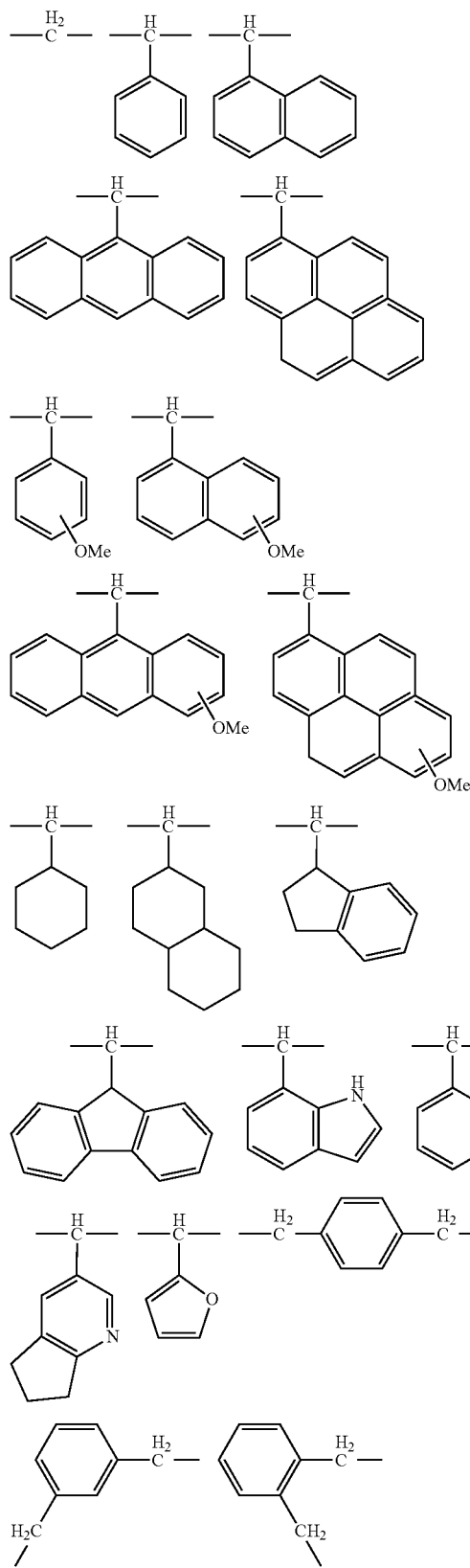
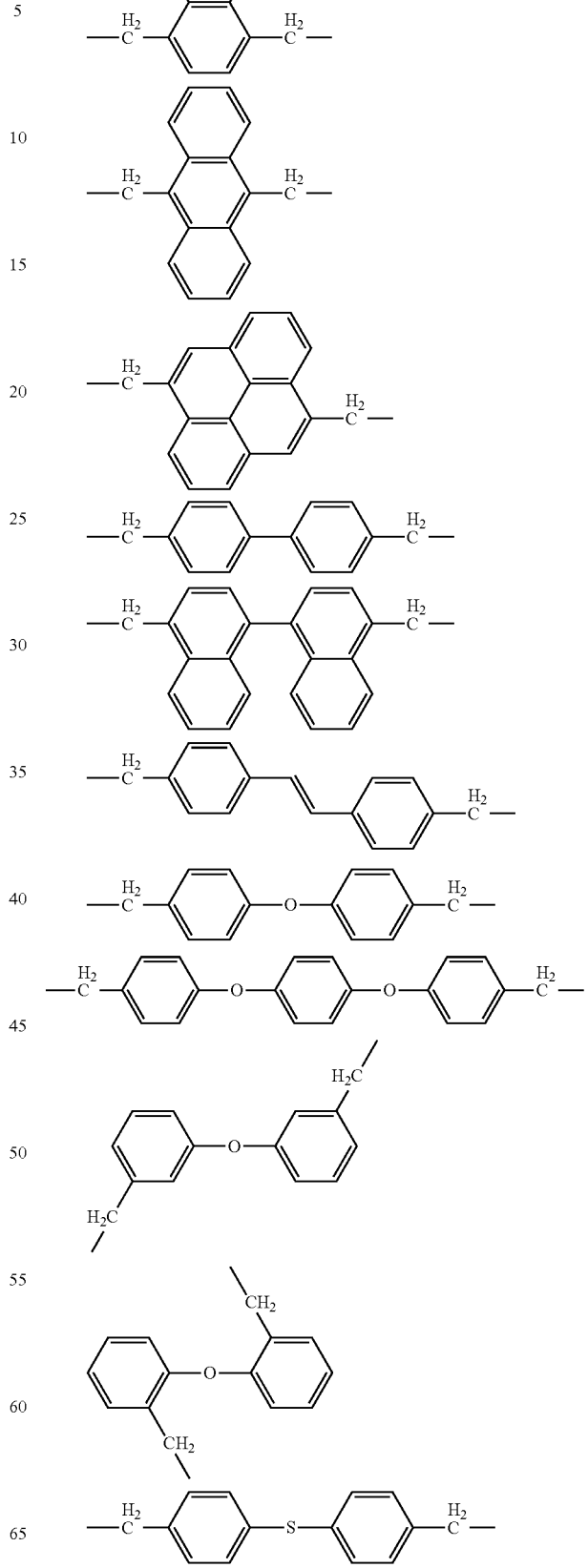

-continued

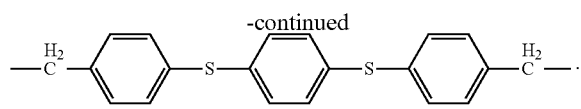

14. The organic layer composition as claimed in claim 13, wherein, in Chemical Formula 4, $A^1$ and $A^2$ are each independently a group including one or more benzene ring.

15. The organic layer composition as claimed in claim 14, wherein, in Chemical Formula 4, $A^1$ and $A^2$ are each independently a group substituted with a substituted or unsubstituted C1 to C20 alkoxy group or a hydroxy group.

16. The organic layer composition as claimed in claim 15, wherein in Chemical Formula 4, $A^1$ and $A^2$ are each independently one of the following groups, in which $M^1$ and $M^2$ are each independently a hydroxy group, a substituted or unsubstituted C1 to C20 alkoxy group, or a combination thereof,

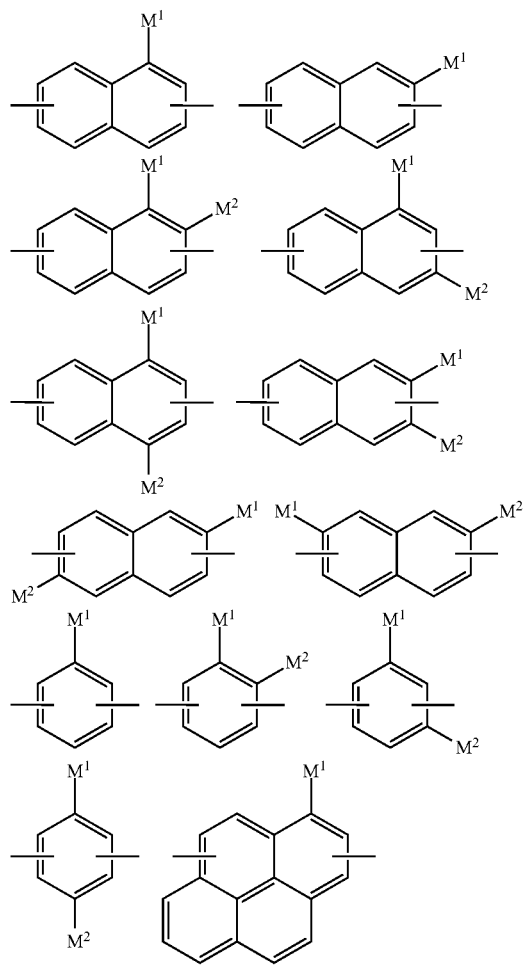

-continued

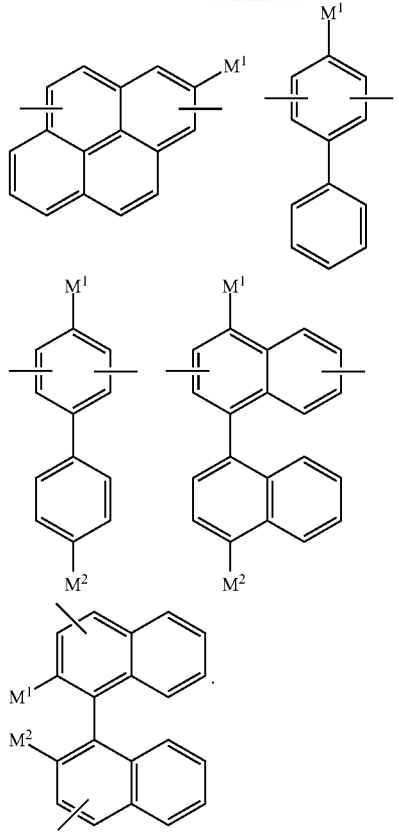

17. A method of forming patterns, the method comprising:
providing a material layer on a substrate,
applying the organic layer composition as claimed in claim 1 on the material layer,
heat-treating the organic layer composition to form a hardmask layer,
forming a silicon-containing thin layer on the hardmask layer,
forming a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

18. The method as claimed in claim 17, wherein applying the organic layer composition includes performing a spin-on coating method.

19. The method as claimed in claim 17, further comprising forming a bottom antireflective coating before forming the photoresist layer.

* * * * *